(12) United States Patent
Amit et al.

(10) Patent No.: US 8,417,982 B1
(45) Date of Patent: Apr. 9, 2013

(54) DUAL CLOCK FIRST-IN FIRST-OUT (FIFO) MEMORY SYSTEM

(75) Inventors: Erez Amit, Rehovot (IL); Dimitry Melts, Tel Aviv (IL); Erez Izenberg, Tel Aviv (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 434 days.

(21) Appl. No.: 12/851,325

(22) Filed: Aug. 5, 2010

Related U.S. Application Data (60) Provisional application No. 61/354,572, filed on Jun. 14, 2010, provisional application No. 61/233,119, filed on Aug. 11, 2009.

(51) Int. Cl.
*G06F 1/12* (2006.01)

(52) U.S. Cl.
USPC .......................................... 713/400; 710/58

(58) Field of Classification Search .......... 713/400–401; 710/52–53, 58, 60; 375/372
See application file for complete search history.

(56) References Cited

U.S. PATENT DOCUMENTS

| 2,632,058 A | 3/1953 | Gray |
| 7,995,622 B1 * | 8/2011 | Fagerlund et al. ............ 370/504 |
| 2010/0306426 A1 * | 12/2010 | Boonstra et al. ................ 710/57 |

OTHER PUBLICATIONS

Nebhrajani, Vijay A., "Asynchronous FIFO Architecture (Part 2)", 10 pages.
Maxfield, Clive, "How to generate Gray Codes for non-power-of-2 sequences", Jun. 29, 2007, 9 pages, Programmable Logic DeisngLine, http://www.eetimes.com/design/programmable-logic/4015117/How-to-generate-Gray-Codes-for-non-power-of-2-sequences.
Cummings, Clifford E., "Simulation and Synthesis Techniques for Asynchronous FIFO Design", 2002, 23 pages, Sunburst Design, Inc., San Jose, CA.

* cited by examiner

*Primary Examiner* — Clifford Knoll (57) ABSTRACT

Some of the embodiments of the present disclosure provide a method for operating a first in first out (FIFO) memory system in different clock domains, the method comprising receiving a write request in a first clock domain; generating, by a write shift and truncation module in response to receiving the write request, a shifted series of binary numbers such that the shifted series of binary numbers is a reduced sub-set of a first series of binary numbers; and generating, by a binary to Gray conversion module, a series of Gray code numbers corresponding to the shifted series of binary numbers. Other embodiments are also described and claimed.

20 Claims, 8 Drawing Sheets

Table 400

| Row Number | Decimal Counter | First series of binary numbers | Write shifted series of binary numbers | Write series of Gray code numbers |
|---|---|---|---|---|
| 0 | 0 | ~~0000~~ | 0010 | 0011 |
| 1 | 1 | ~~0001~~ | 0011 | 0010 |
| 2 | 2 | 0010 | 0100 | 0110 |
| 3 | 3 | 0011 | 0101 | 0111 |
| 4 | 4 | 0100 | 0110 | 0101 |
| 5 | 5 | 0101 | 0111 | 0100 |
| 6 | 6 | 0110 | 1000 | 1100 |
| 7 | 7 | 0111 | 1001 | 1101 |
| 8 | 8 | 1000 | 1010 | 1111 |
| 9 | 9 | 1001 | 1011 | 1110 |
| 10 | 10 | 1010 | 1100 | 1010 |
| 11 | 11 | 1011 | 1101 | 1011 |
| 12 | 12 | 1100 | | |
| 13 | 13 | 1101 | | |
| 14 | 14 | ~~1110~~ | | |
| 15 | 15 | ~~1111~~ | | |

DUAL CLOCK FIRST-IN FIRST-OUT (FIFO) MEMORY SYSTEM

CROSS REFERENCE TO RELATED APPLICATIONS

The present application claims priority to U.S. Patent Application No. 61/233,119, filed Aug. 11, 2009 and U.S. Patent Application No. 61/354,572, filed Jun. 14, 2010, the entire specifications of which are hereby incorporated by reference in their entirety for all purposes, except for those sections, if any, that are inconsistent with this specification.

TECHNICAL FIELD

Embodiments of the present disclosure relate to memory systems in general, and more specifically, to dual clock first-in first-out (FIFO) memory systems.

BACKGROUND

Unless otherwise indicated herein, the approaches described in this section are not prior art to the claims in the present disclosure and are not admitted to be prior art by inclusion in this section.

A dual clock first-in first-out (FIFO) memory system is generally used to transfer data between two clock domains having different clock frequencies. A memory array included in a conventional FIFO memory system usually includes a plurality of memory entries, where a number of memory entries included in the memory array is generally a power of 2.

SUMMARY

In various embodiments, the present disclosure provides a method for operating a first in first out (FIFO) memory system in different clock domains, the method comprising receiving a write request in a first clock domain; generating, by a write shift and truncation module in response to receiving the write request, a shifted series of binary numbers such that the shifted series of binary numbers is a reduced sub-set of a first series of binary numbers; and generating, by a binary to Gray conversion module, a series of Gray code numbers corresponding to the shifted series of binary numbers. There is also provided a memory system comprising a memory array; and a memory controller that includes a write domain module configured to receive a write request from a write clock domain, the write domain module comprising a shift and truncation module configured to generate a shifted series of binary numbers such that the shifted series of binary numbers is a reduced sub-set of a first series of binary numbers; and a binary to Gray conversion module configured to generate a series of Gray code numbers corresponding to the shifted series of binary numbers. There is also provided a system-on-chip (SOC) comprising a processor; and a memory system comprising a memory array, wherein the memory array has 2M entries, wherein M is an integer, wherein Y is an integer and is equal to a ceiling function of logarithm of 2M to a base of 2, wherein K is an integer and is equal to $((2Y-2M)/2)$; and a memory controller that includes a read domain module configured to receive a read request from a read clock domain. In an embodiment, the read domain module comprises a first shift and truncation module configured to generate a read shifted series of binary numbers, wherein the read shifted series of binary numbers includes 2M number of consecutive binary numbers starting from K; and a first binary to Gray conversion module configured to generate a read series of Gray code numbers corresponding to the read shifted series of binary numbers.

BRIEF DESCRIPTION OF THE DRAWINGS

In the following detailed description, reference is made to the accompanying drawings which form a part hereof wherein like numerals designate like parts throughout, and in which is shown by way of embodiments that illustrate principles of the present disclosure. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

DETAILED DESCRIPTION

As is well known to those to those skilled in the art, a ceiling function maps a real number to the smallest following integer. Thus, ceiling function of a number is the smallest integer not less than the number. For example, ceiling function of 3.7 is 4.

Gray code (also known as reflected binary code) is a binary numeric system where two successive values differ by only one bit. For the purpose of the present disclosure and unless otherwise disclosed, this property of Gray codes (i.e., two successive values differing by only one bit) is also referred to as a difference property of Gray codes. For example, 0, 1, 2, . . . , 7 in decimal (i.e., 3 bit binary data) would be represented as 000, 001, 011, 010, 110, 111, 101, and 100, respectively, in Gray codes. Accordingly, there is a difference of only one bit (e.g., the middle bit for Gray code equivalent of decimal numbers 1 and 2) in any two successive or consecutive Gray code numbers.

Also, for a N bit series of Gray code numbers (where N is an integer, where the series includes $2^N$ number of consecutive Gray codes starting from 0, and where N=3 for the previous example), when the Gray code reaches the highest number in the series, the Gray code wraps around such that the highest number in the series and the lowest number in the series also differs by only one bit. This is also referred to as a cyclic property of Gray codes. Thus, for example, the Gray code equivalent of 0 and 7 in decimal (i.e., 000 and 100 in Gray code) also differs by only one bit.

In a N bit series of Gray code numbers, if a lowest K number of Gray codes and a highest K number of Gray codes (where K is an integer, and 2K is less than a number of Gray codes included in a series of $2^N$ Gray code numbers) are eliminated or "chopped off" from the series, the truncated series of Gray code numbers also maintains the cyclic property of Gray code. In another example, in the N bit series of Gray code numbers, if the middle 2M number of Gray codes (where M is an integer) are eliminated or chopped off from the series, the truncated series of Gray code numbers also maintains the cyclic property and the difference property of Gray codes. For the purpose of the present disclosure and unless otherwise disclosed, this property of Gray codes (i.e., the property associated with the truncated series also exhibiting the cyclic property and the difference property) is also referred to as a symmetrical property of Gray codes.

For example, for N=3, the series of Gray code numbers includes 000, 001, 011, 010, 110, 111, 101, and 100, as previously disclosed. For K=2, the lowest two (i.e., 000 and 001) and the highest two (i.e., 101 and 100) numbers from this series of Gray code numbers are eliminated or chopped off, leaving behind a truncated series of Gray code numbers 011, 010, 110, and 111. In the truncated series of Gray code numbers, any two successive values differ by only one bit. Furthermore, the truncated series of Gray code numbers also wraps around, such that the highest number (111) and the lowest number (011) in the truncated series of Gray code numbers also differs by only one bit. Thus, the truncated series of Gray code numbers also exhibits the cyclic property and the difference property. Accordingly, the series of Gray code numbers exhibits the symmetric property as well.

In another example, for N=3 and M=2, if the middle 2M numbers are eliminated from the series of Gray code numbers, a second truncated series of Gray code numbers includes 000, 001, 011, 111, 101, and 100. In the second truncated series of Gray code numbers, any two successive values differ by only one bit. Thus, the second truncated series of Gray code numbers also has the cyclic property and the difference property, and accordingly, the series of Gray code numbers exhibits the symmetric property as well.

Figure 1:
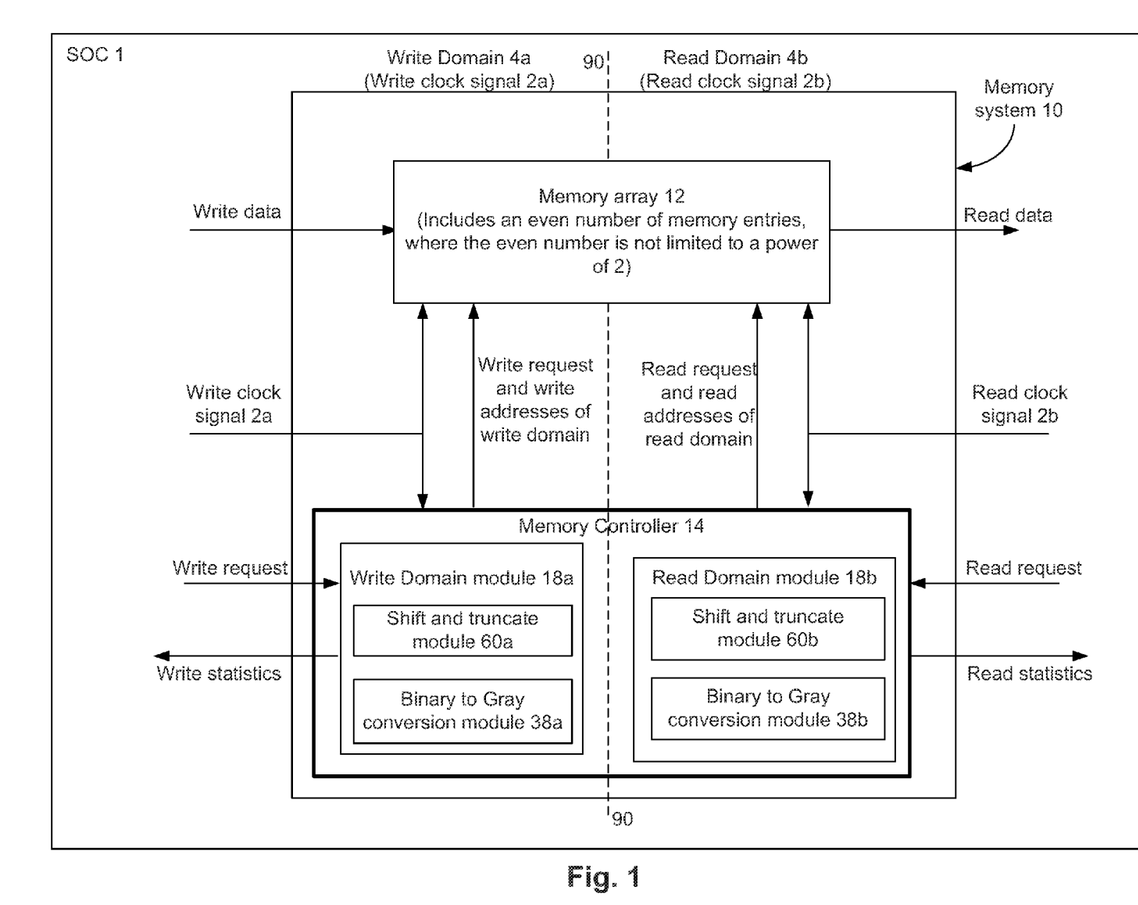
FIG. 1 schematically illustrates a system-on-chip (SOC) 1 that includes a memory system, in accordance with an embodiment of the present disclosure.

FIG. 1 schematically illustrates a system-on-chip (SOC) 1 that includes a memory system 10, in accordance with an embodiment of the present disclosure. Although not illustrated in FIG. 1, in an embodiment, the SOC 1 includes one or more processing cores or processors configured to control and/or process one or more operations of the SOC 1. Although not illustrated in FIG. 1, in an embodiment, the SOC 1 also includes one or more peripherals. The memory system 10 includes a memory array 12 and a memory controller 14. Although not illustrated in FIG. 1, in an embodiment, the memory array 12 includes a plurality of memory entries, where each memory entry of the memory array 12 includes one or more memory cells configured to store one or more bits of data. The memory array 12 includes an even number of memory entries. In an embodiment, the number of memory entries included in the memory array 12 is not limited to a power of 2. The memory controller 14 includes a write domain module 18a and a read domain module 18b. In an embodiment, the write domain module 18a includes a binary to Gray conversion module 38a and a shift and truncate module 60a. As will be discussed in more detail herein later, the binary to Gray conversion module 38a and the shift and truncate module 60a are configured to generate a series of Gray code numbers corresponding to a shifted series of binary numbers, where the series of Gray code numbers are used to generate special Gray write addresses for the memory system 10. In an embodiment, the read domain module 18a includes a binary to Gray conversion module 38b and a shift and truncate module 60b. As will be discussed in more detail herein later, the binary to Gray conversion module 38b and the shift and truncate module 60b are configured to generate another series of Gray code numbers corresponding to another shifted series of binary numbers, where the another series of Gray code numbers are used to generate special Gray read addresses for the memory system 10.

In an embodiment, the memory array 12 is, for example, a random access memory (RAM), or any other appropriate type of memory. In an embodiment, the memory controller 14 is a FIFO memory controller (e.g., operates the memory array 12 on a first-in, first-out basis), and the memory system 10 is a FIFO memory system.

In various embodiments, the memory system 10 is divided into two domains by a dotted line 90: a domain to the left side of the line 90 (labeled as domain 4a) and a domain to the right side of the line 90 (labeled as domain 4b). Data is transferred, through the memory system 10, from domain 4a to domain 4b. Data is written to the memory array 12 from the domain 4a. Accordingly, the domain 4a is also referred to as write domain 4a. Similarly, data is read from the memory array 12 by the domain 4b. Accordingly, the domain 4b is also referred to as read domain 4b.

One or more components in the write domain 4a are driven by a clock signal 2a (also referred to as a write clock signal 2a), and one or more components in the read domain 4b are driven by a clock signal 2b (also referred to as a read clock signal 2b). One or more components included in, or external to the memory system 10, which are driven by (or associated with) the write clock signal 2a, are assumed to be included in, or associated with the write domain 4a. Similarly, one or more components included in, or external to the memory system 10, which are driven by (or associated with) the read clock signal 2b, are assumed to be included in, or associated with the read domain 4b.

In an embodiment, a frequency of the write clock signal 2a is different from a frequency of the read clock signal 2b, although in other embodiments, the frequency of the write clock signal 2a is same as the frequency of the read clock signal 2b. In an embodiment, the write clock signal 2a and the read clock signal 2b are asynchronous clock signals (although the teachings of this disclosure are not limited to asynchronous clock signals). Thus, the memory system 10 is an asynchronous dual clock memory system, where data is transferred, through the memory system 10, from a first domain (i.e., the write domain 4a) driven by a first clock signal (i.e., the write clock signal 2a) with a first clock frequency to a second domain (i.e., the read domain 4b) driven by a second clock signal (i.e., read clock signal 2b) having a second frequency that is different from the first frequency. In an embodiment, both the memory array 12 and the memory controller 14 receive the write clock signal 2a and the read clock signal 2b.

The memory array 12 receives write data from one or more components (e.g., one or more components that are external to the memory system 10) of the write domain 4a. The memory controller 14 receives a corresponding write request (e.g., corresponding to the write data) from one or more components (e.g., one or more components that are external to the memory system 10) of the write domain 4a. Based at least in part on receiving the write request, the memory controller 14 (e.g., the write domain module 18a) generates write addresses of write domain (which are transmitted to the memory array 12), and also generates special Gray series of write addresses of write domain (which are transmitted to a write to read synchronization module, as will be discussed in more detail herein later). The phrase "write domain" suffixed in the phrases "write addresses of write domain" and "special Gray series of write addresses of write domain" signifies that these addresses are generated and/or used by, and/or are associated with components of the write domain 4a. The write addresses of write domain include addresses in the memory array 12 where the write data is to be written. The special Gray series of write addresses of write domain include equivalent special Gray addresses, which are used to transmit the write addresses of write domain to the read domain. The memory system 10 writes the write data to the memory array 12 based at least in part on the memory array 12 receiving the write addresses of write domain from the memory controller 12.

The memory controller 14 receives a read request from one or more components (e.g., one or more components that are external to the memory system 10) of the read domain 4b. The read request is configured to request the memory system 10 to read data from the memory array 12 (e.g., data that was written to the memory array 12 earlier). Based at least in part on receiving the read request, the memory controller 14 (e.g., the read domain module 18b) generates read addresses of read domain (which are transmitted to the memory array 12), and also generates special Gray series of read addresses of read domain (which are transmitted to a read to write synchronization module, as will be discussed in more detail herein later). The phrase "read domain" suffixed in the phrases "read addresses of read domain" and "special Gray series of read addresses of read domain" signifies that these addresses are generated and/or used by, and/or are associated with components of the read domain 4b. In an embodiment, the read addresses of read domain include addresses in the memory array 12 from where read data is to be read and transmitted to one or more components in the read domain 4b. The special Gray series of read addresses of read domain include equivalent special Gray addresses, which are used to transmit the read addresses of read domain to the write domain.

In one embodiment, the memory system 10 utilizes Gray codes to generate special Gray write addresses of write domain and/or special Gray read addresses of read domain, which are used, in addition to the write addresses of write domain and read addresses of write domain, to facilitate transfer of data from the write domain 4a to the read domain 4b through the memory array 12.

The previously disclosed difference property and cyclic property of Gray codes are exploited in conventional asynchronous dual clock memory systems, in which pointers based on Gray codes are used to synchronize data between a write domain and a read domain, and are also used to generate special Gray read and/or write addresses and/or various status signals for the memory system. Local pointers in a conventional asynchronous dual clock memory system use the difference property of Gray codes such that a Gray code counter is incremented or decremented by only one bit with each address change in a memory array. When the pointers reach the highest (or lowest) number in the Gray code series, the pointers are wrapped around, which also results in a change of only one bit due to the cyclic property of Gray code.

A conventional asynchronous dual clock FIFO memory system uses a N bit counter (where N is an integer) for generating the pointers. Because of this, there has to be $2^N$ number of possible values of the pointers in the conventional asynchronous dual clock FIFO memory system. Accordingly, in a memory array of a conventional asynchronous dual clock FIFO memory system using Gray code numbers, there has to be exactly $2^N$ number of memory entries. For example, for N=8, in a memory array of a conventional memory system, there has to be exactly 256 number of memory entries. In a case where the conventional FIFO memory system has less than 256 memory entries in its memory array, e.g., 200 memory entries, the pointer has to be wrapped around at a Gray number that is equivalent to 200. However, such a wrap around at 200 (e.g., instead of a wrap around at 256) does not result in the cyclic property of Gray code. That is, during such a wrap around at 200 (e.g., instead of a wrap around at 256), more than one bit in the pointer changes. Accordingly, such a wrap around at 200 results in a discontinuity in the Gray code behavior, which creates error in generation of pointers in the conventional asynchronous dual clock FIFO memory system. Accordingly, in a FIFO memory system of a conventional asynchronous dual clock FIFO memory system, there has to be exactly $2^N$ number of memory entries, even if a different number of memory entries in the memory array are desired.

In an embodiment, the memory system 10 of FIG. 1 uses the symmetric property of Gray code (along with the difference property and cyclic property) to generate special Gray write and/or read addresses (e.g., using the write domain module 18a and the read domain module 18b), such that the memory array 12 can have any even sized memory entries, as will be disclosed in more detail herein later. Thus, unlike a conventional memory array, the number of memory entries of the memory array 12 need not be limited to a power of 2. Rather, the memory array 12 can have any even sized memory entries.

As will be further disclosed in more detail herein, in an embodiment, the memory system 10 of FIG. 1 (e.g., the write domain module 18a) receives a write request in the write domain; generates, in response to receiving the write request, a shifted series of binary numbers such that the shifted series of binary numbers is a reduced sub-set of a first series of binary numbers; generates a series of Gray code numbers corresponding to the shifted series of binary numbers; generates a series of special Gray write addresses corresponding to the series of Gray code numbers; and facilitates in transmitting data from the write domain to the memory array 12, based at least in part on generating the series of special Gray write addresses. In an embodiment, in response to receiving the write request, the first series of binary numbers is generated, based at least in part on which the shifted series of binary numbers is generated.

Figure 2:
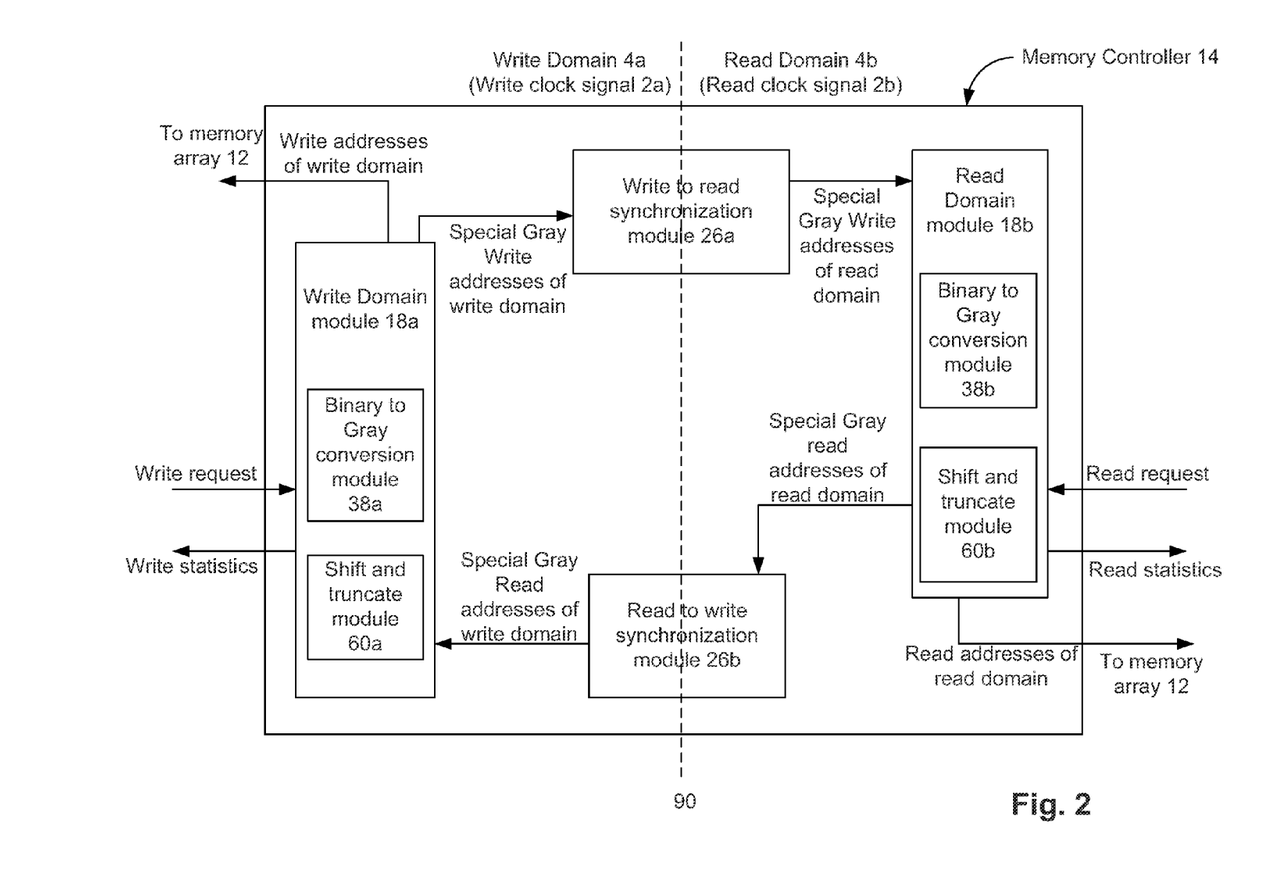
FIG. 2 schematically illustrates a memory controller of FIG. 1 in more detail, in accordance with an embodiment of the present disclosure.

FIG. 2 schematically illustrates the memory controller 14 of FIG. 1 in more detail, in accordance with an embodiment of the present disclosure. As illustrated in FIGS. 1 and 2, the memory controller 14 includes the write domain module 18a and the read domain module 18b. The memory controller 14 also includes a write to read synchronization module 26a, and a read to write synchronization module 26b. The write domain module 18a receives the write request, and generates write addresses of write domain and also special Gray write address at write domain. The generated write addresses of write domain are transmitted to the memory array 12, and the generated special Gray write address at write domain are transmitted to the write to read synchronization module 26a. The write to read synchronization module 26a generates special Gray write addresses of read domain in response to receiving the special Gray write addresses of write domain, based at least in part on the write clock signal 2a and the read clock signal 2b. Thus, the write to read synchronization module 26a synchronizes or transforms the special Gray write addresses of write domain to the special Gray write addresses of read domain.

The read domain module 18b receives the read request, and generates read addresses of read domain. The generated read addresses of read domain are transmitted to the memory array 12, and the generated special Gray read address at read domain are transmitted to the read to write synchronization module 26b. The read to write synchronization module 26b generates special Gray read addresses of write domain in response to receiving the special Gray read addresses of read domain, based at least in part on the write clock signal 2a and the read clock signal 2b. Thus, the read to write synchronization module 26b synchronizes or transforms the special Gray read addresses of read domain to the special Gray read addresses of write domain, based at least in part on the write clock signal 2a and the read clock signal 2b, to maintain first-in, first-out property of the memory system 10.

In an embodiment, the write domain module 18a generates one or more write statistics signal, and/or the read domain module 18b generates one or more read statistics signal.

Figure 3:
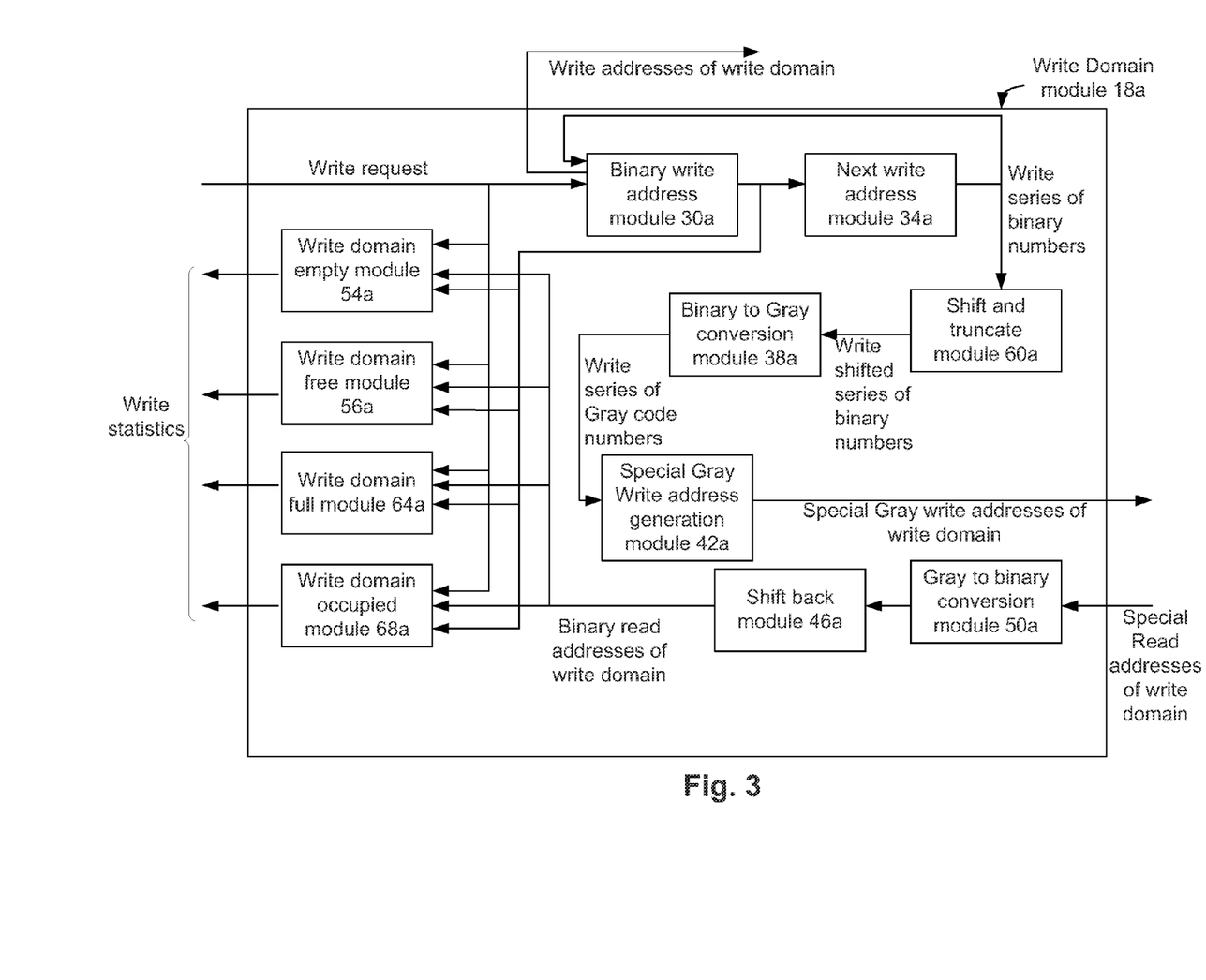
FIG. 3 schematically illustrates a write domain module of FIGS. 1 and 2 in more detail, in accordance with an embodiment of the present disclosure.

FIG. 3 schematically illustrates the write domain module 18a of FIGS. 1 and 2 in more detail, in accordance with an embodiment of the present disclosure. In an embodiment, the write domain module 18a includes a binary write address module 30a configured to receive the write request. In an embodiment, the binary write address module 30a generates write addresses of write domain, which is transmitted to the memory array 12. Also, an output of the binary write address module 30a is input to a next write address module 34a. The next write address module 34a outputs a write series of binary numbers, which is fed back to the binary write address module 30a and which is also input to a shift and truncate module 60a. The shift and truncate module 60a generates a write shifted series of binary numbers, which is input to the binary to Gray conversion module 38a. The binary to Gray conversion module 38a generates a write series of Gray code numbers, which is input to a write address generation module 42a. The write address generation module 42a, based at least in part on the write series of Gray code numbers, generates the special Gray write addresses of write domain.

The write domain module 18a also includes a Gray to binary conversion module 50a, which receives special Gray read addresses of write domain from the read to write synchronization module 26b of FIG. 2. The output of the Gray to binary conversion module 50a is input to a shift back module 46a, the output of which is input to a write domain empty module 54a, a write domain free module 56a, a write domain full module 64a, and a write domain occupied module 68a. The write domain empty module 54a, the write domain free module 56a, the write domain full module 64a, and the write domain occupied module 68a also receive the write request and the output of the binary write address module 30a, and generate various write statistics signals.

Figure 4:
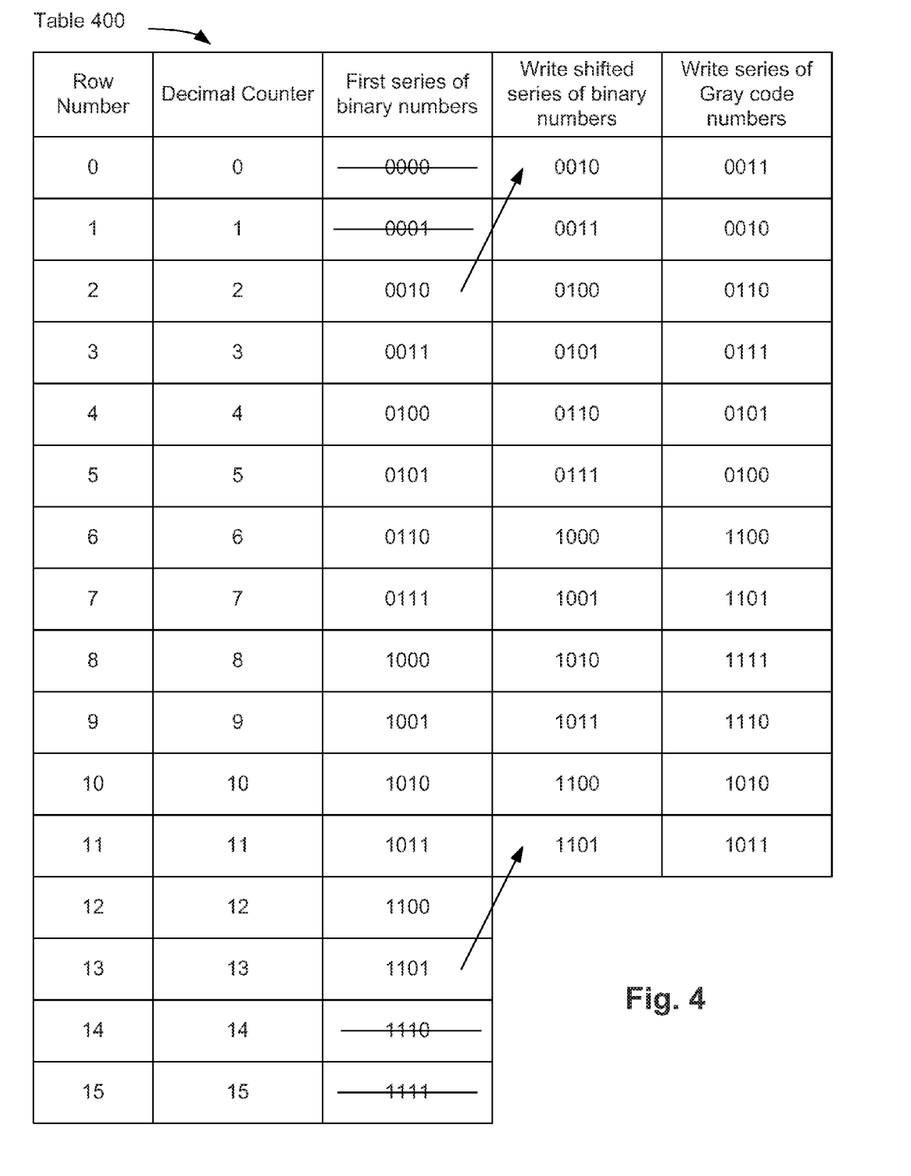
FIG. 4 illustrates a table that illustrates generation of the write series of Gray code numbers by the write domain module of FIGS. 1-3, in accordance with an embodiment of the present disclosure.
Figure 5:
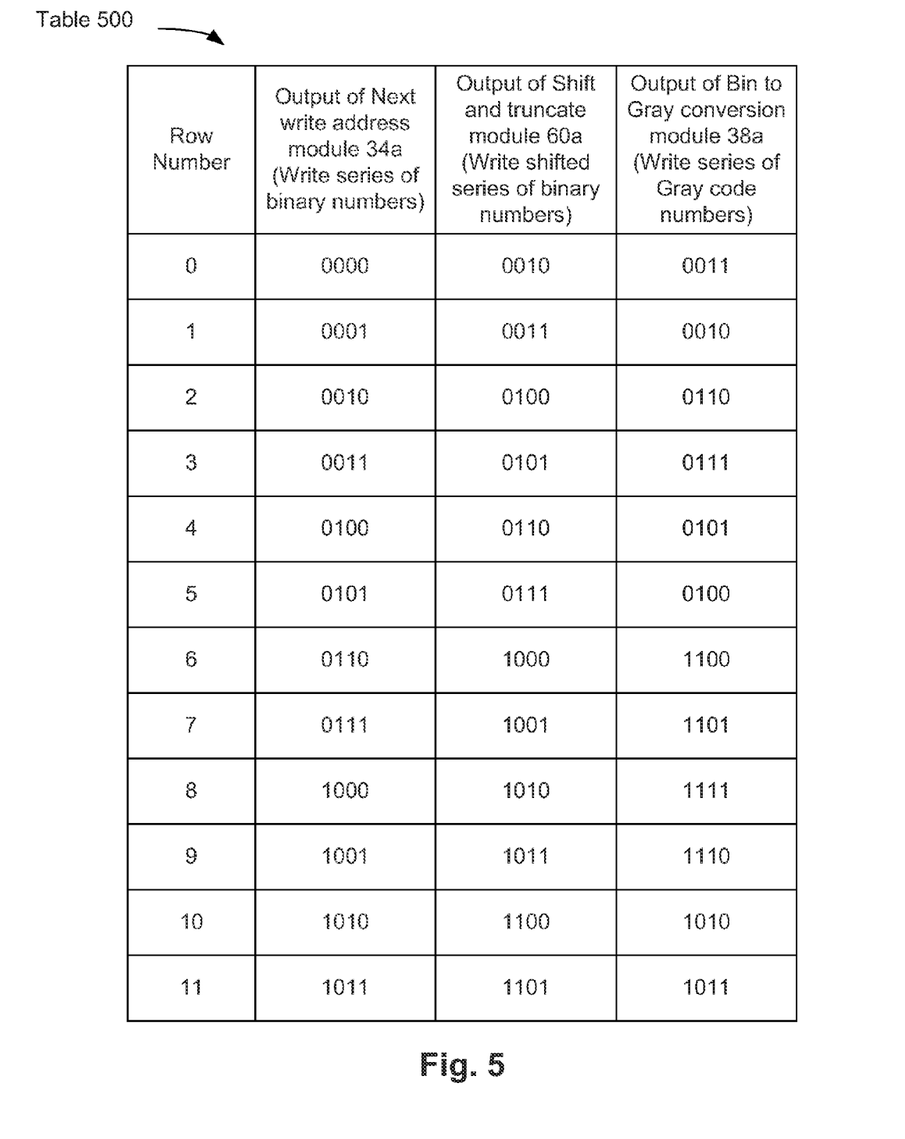
FIG. 5 illustrates a table that illustrates various series of numbers generated by various components of the write domain module of FIGS. 1-3, in accordance with an embodiment of the present disclosure.

FIG. 4 illustrates a Table 400 that illustrates generation of the write series of Gray code numbers by the write domain module 18a of FIGS. 1-3, in accordance with an embodiment of the present disclosure. Also, FIG. 5 illustrates a Table 500 that illustrates various series of numbers generated by various components of the write domain module 18a of FIGS. 1-3, in accordance with an embodiment of the present disclosure. The Table 400 includes 15 rows, each identified by a corresponding row number. Also, the Table 500 includes 12 rows, each identified by a corresponding row number. An operation of the write domain module 18a is explained using Tables 400 and 500.

As previously alluded to, in an embodiment, the memory array 12 of FIG. 1 includes any even number of memory entries. As an example and unless otherwise mentioned, the memory array 12 is assumed to include 12 memory entries, although the principles of the present disclosure are not, in any manner, limited to such an example number of memory entries.

Referring to FIG. 3, the binary write address module 30a, in addition to generating the write addresses of write domain, also generates a series of binary numbers starting from 0000, based on a received write request. The next write address module 34a outputs a corresponding write series of binary numbers. The next write address module 34a, through a feedback to the binary write address module 30a, resets the series of binary numbers generated by the binary write address module 30a once the write series of binary numbers reaches binary equivalent of decimal number 11. That is, as the memory array 12 includes 12 entries, the write series of binary number, output by the next write address module 34a, includes binary equivalent of decimal numbers 0, 1, 2, . . . , 11. The write series of binary number corresponds to the generated write addresses of write domain (e.g., each entry in the write series of binary number has a respective entry in the write addresses of write domain). Once binary equivalent of decimal number 11 is reached, the write series of binary numbers is wrapped around (i.e., reset to binary equivalent of decimal number 0). Thus, as illustrated in the second column of Table 500, the write series of binary numbers, generated by the next write address module 34a, includes 0000, 0001, 0010, . . . , 1011, and this sequence is repeated corresponding to the write addresses of write domain (although the repetition of the series is not illustrated in Table 500). In various other embodiments, the write series of binary numbers is generated in any other appropriate manner.

The shift and truncate module 60a, in response to receiving the write series of binary numbers, generates the write shifted series of binary numbers. In an embodiment, the write shifted series of binary numbers (illustrated in the fourth column of Table 400) are generated such that the write shifted series of binary numbers has a reduced sub-set of a first series of binary numbers (illustrated in the third column of Table 400). Thus, each entry in the write shifted series of binary numbers has a respective entry in the write addresses of write domain generated by the binary write address module 30a.

In case the memory array 12 has 2M entries (where M is an integer) and logarithm of 2M to a base of 2 is not necessarily an integer, the first series of binary numbers includes $2^Y$ number of consecutive binary numbers, starting from zero, where Y is an integer and is equal to the ceiling function of logarithm of 2M to the base of 2. In an embodiment, Y is an address width of the memory system 10, which represents a binary or Gray code width of write addresses and read addresses.

For example, for the above disclosed example in which the memory array 12 includes 12 entries, 2M is equal to 12, and Y=ceiling $(\log_2(12))$≈ceiling $(3.584)$=4. Thus, the address width Y of the memory system 10 is 4, and the first series of binary numbers includes $2^4$, i.e., 16 binary numbers, starting from zero, as illustrated in FIG. 4.

As previously disclosed, the write shifted series of binary numbers has a reduced sub-set of the first series of binary numbers. For example, the write shifted series of binary numbers is generated such that the reduced subset of the first series of binary numbers excludes a first K number of binary entries and a last K number of binary entries of the $2^Y$ number of consecutive binary entries of the first series of binary numbers, where K is equal to $((2^Y-2M)/2)$. For example, the write shifted series of binary numbers is generated by eliminating the first K number of binary entries and the last K number of binary entries from the first series of binary numbers. Thus, the write shifted series of binary numbers includes 2M number of consecutive binary numbers starting from K. That is, a number of entries included in the write shifted series of binary numbers is equal to the number of memory entries in the memory array 12.

For example, in the above disclosed example with 2M=12, K is equal to $((2^4-12)/2)=2$. Thus, as illustrated in the third and fourth columns of Table 400, the write shifted series of binary numbers has a reduced sub-set of the first series of binary numbers, where the reduced sub-set of the first series of binary numbers excludes the first two and the last two entries of the first series of binary numbers. Thus, as illustrated in the fourth column of Table 400, the write shifted series of binary numbers includes 0010, 0011, ..., 1101, and the series is wrapped around or repeated when the last number of the series is reached (although the repetition of the series is not illustrated in Table 400). Thus, the write shifted series of binary numbers includes 0010, 0011, ..., 1101, 0010, 0011, ..., 1101, 0010, 0011, ..., 1101, and so on. The third column of Table 500 also illustrates the write shifted series of binary numbers that is generated and output by the shift and truncate module 60a.

In a first embodiment, the write shifted series of binary numbers can be generated from the first series of binary numbers. In a second embodiment, the write shifted series of binary numbers can be generated independently (i.e., not from the first series of binary numbers). That is, for this a second embodiment, the concept of the first series of binary numbers is useful for understanding a structure of the write shifted series of binary numbers, but the write shifted series of binary numbers is not necessarily generated from the first series of binary numbers. For example, in this embodiment, the write shifted series of binary numbers is generated as a series of 2M consecutive binary numbers starting from K.

The binary to Gray conversion module 38a receives the write shifted series of binary numbers, and generates the corresponding write series of Gray code numbers, as illustrated in the last column of the Table 400 (also illustrated in the fourth column of Table 500). Thus, each entry in the write series of Gray code numbers is generated by a binary to Gray code conversion of a corresponding entry in the write shifted series of binary numbers. Although not illustrated in Tables 400 and 500, the write series of Gray code numbers is also wrapped around or repeated when the last number of the series is reached. Thus, the write series of Gray code numbers includes 0011, 0010, ..., 1011, 0011, 0010, ..., 1011, 0011, 0010, ..., 1011, and so on.

Referring again to FIG. 3, the write address generation module 42a receives the write series of Gray code numbers, and generates the special Gray write address of write domain based at least in part on the received write series of Gray code numbers. Thus, each entry in the special Gray write address of write domain has a corresponding entry in the write addresses of write domain generated by the binary write address module 30a. Thus, the special Gray write address of write domain is a special Gray equivalent of the write addresses of write domain.

As seen from Tables 400 and 500, the last entry (i.e., 1011) and the first entry (i.e., 0011) of the write series of Gray code numbers differ by only one bit (i.e., the most significant bit). That is, due to the symmetrical property of Gray codes, the write series of Gray code numbers exhibits the difference property and the cyclic property of Gray codes. Accordingly, while the write series of Gray code numbers are wrapped around or repeated, there is a change of only one bit in the write series of Gray code numbers. Thus, such a wrap around does not result in any discontinuity in the difference property, even though the number of memory entries in the memory array 12 (and also the number of successive Gray code numbers in the write series of Gray code numbers) is not necessarily a power of 2. In contrast, as previously noted, the number of memory entries in a conventional memory array has to be exactly a power of 2. Thus, generating the write series of Gray code numbers from the write shifted series of binary numbers provides flexibility in choosing any appropriate even number of memory entries for the memory array 12 (e.g., instead of limiting the number of entries of the memory array 12 to be exactly a power of 2, as in a conventional memory array), thereby providing a greater flexibility in design of the memory system 10.

In an embodiment, the write domain module 18a (e.g., the Gray to binary conversion module 50a) also receives the special read addresses of write domain. The Gray to binary conversion module 50a generates a binary form of the received read addresses of write domain. The shift back module 46a performs a reverse operation of the above disclosed shift and truncation operation (i.e., the operation performed by the shift and truncation module 60a) to generate binary read addresses of write domain, which is used at least in part by the write domain empty module 54a, the write domain free module 56a, the write domain full module 64a, and the write domain occupied module 68a to generate various write statistics signals.

Figure 6:
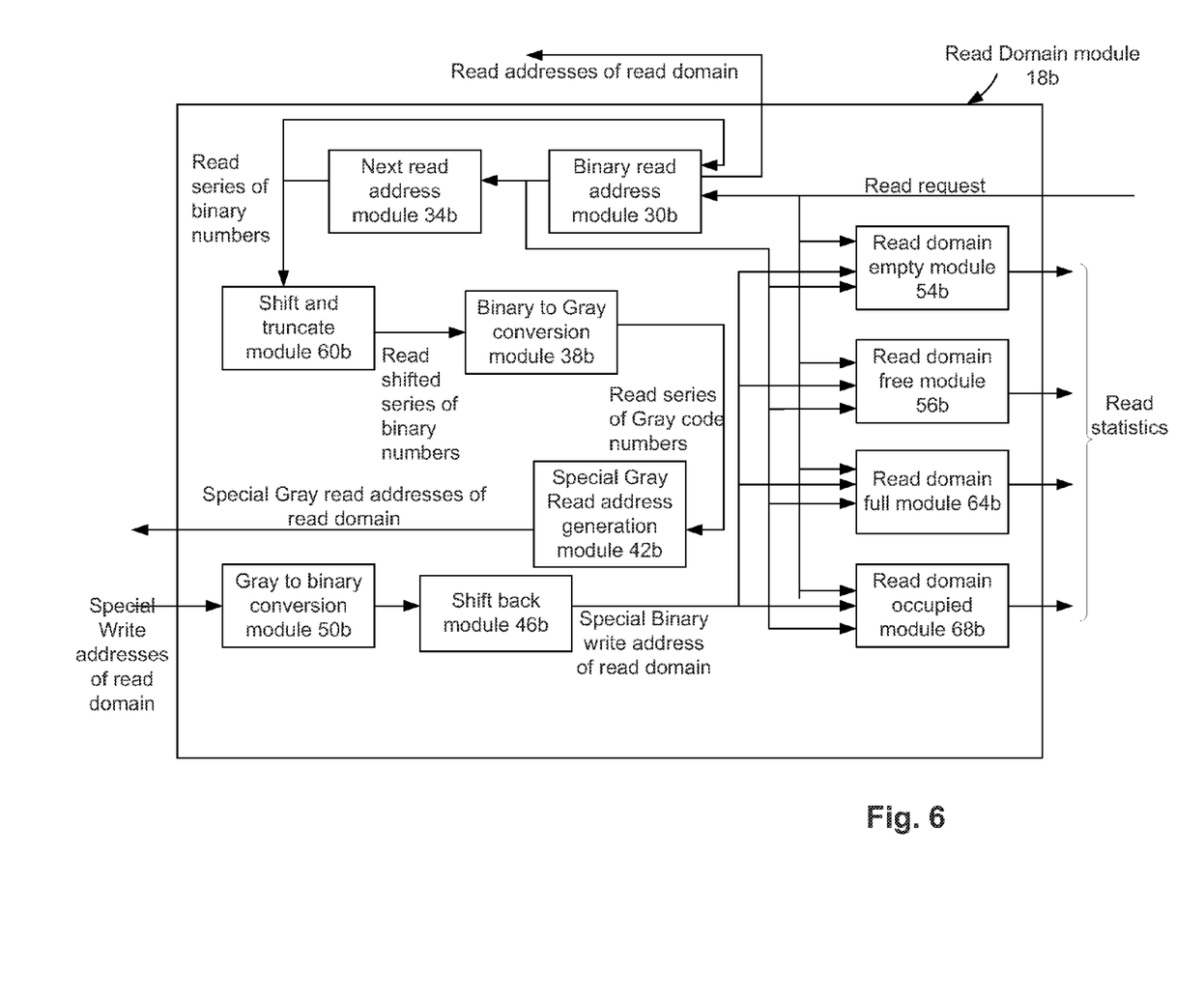
FIG. 6 schematically illustrates a read domain module of FIGS. 1 and 2 in more detail, in accordance with an embodiment of the present disclosure.

FIG. 6 schematically illustrates the read domain module 18b of FIGS. 1 and 2 in more detail, in accordance with an embodiment of the present disclosure. The read domain module 18b has one or more components that correspond to respective one or more components of the write domain module 18a. For example, the read domain module 18b includes a binary read address module 30b configured to receive the read request, and to generate read addresses of read domain (for transmission to the memory array 12). An output of the binary read address module 30b is input to a next read address module 34b. The next write address module 34a outputs a read series of binary numbers, which is fed back to the binary read address module 30b and which is also input to a shift and truncate module 60b. The shift and truncate module 60b generates a read shifted series of binary numbers, which is input to a binary to Gray conversion module 38b. The binary to Gray conversion module 38b generates a read series of Gray code numbers, which is input to a read address generation module 42b. The read address generation module 42b, based at least in part on the received read series of Gray code numbers, generates the special Gray read addresses of read domain. The special Gray read addresses of read domain corresponds to the read addresses of read domain generated by the binary read address module 30b. That is, each entry in the special Gray read addresses of read domain corresponds to a respective entry in the read addresses of read domain.

Generation of the read series of binary numbers, read shifted series of binary numbers, and the read series of Gray code numbers in the read domain 18b are performed at least in part similar to generation of the corresponding series of numbers in the write domain 18a. Accordingly, for the sake of brevity, a detailed description of generation of the read series of binary numbers, read shifted series of binary numbers, and the read series of Gray code numbers are not disclosed herein.

The read domain module 18b also includes a Gray to binary conversion module 50b, which receives the special Gray write addresses of read domain from the write to read synchronization module 26a of FIG. 2. The output of the Gray to binary conversion module 50b is input to a shift back module 46b, the output of which is input to a read domain empty module 54b, a read domain free module 56b, a read domain full module 64b, and a read domain occupied module 68b. Functionality of these modules are in part similar to corresponding modules of the write domain module 18a. For example, the read domain empty module 54b, the read domain free module 56b, the read domain full module 64b, and the read domain occupied module 68b also receive the read request and the output of the binary read address module 30b, and generate various read statistics signals.

Figure 7:
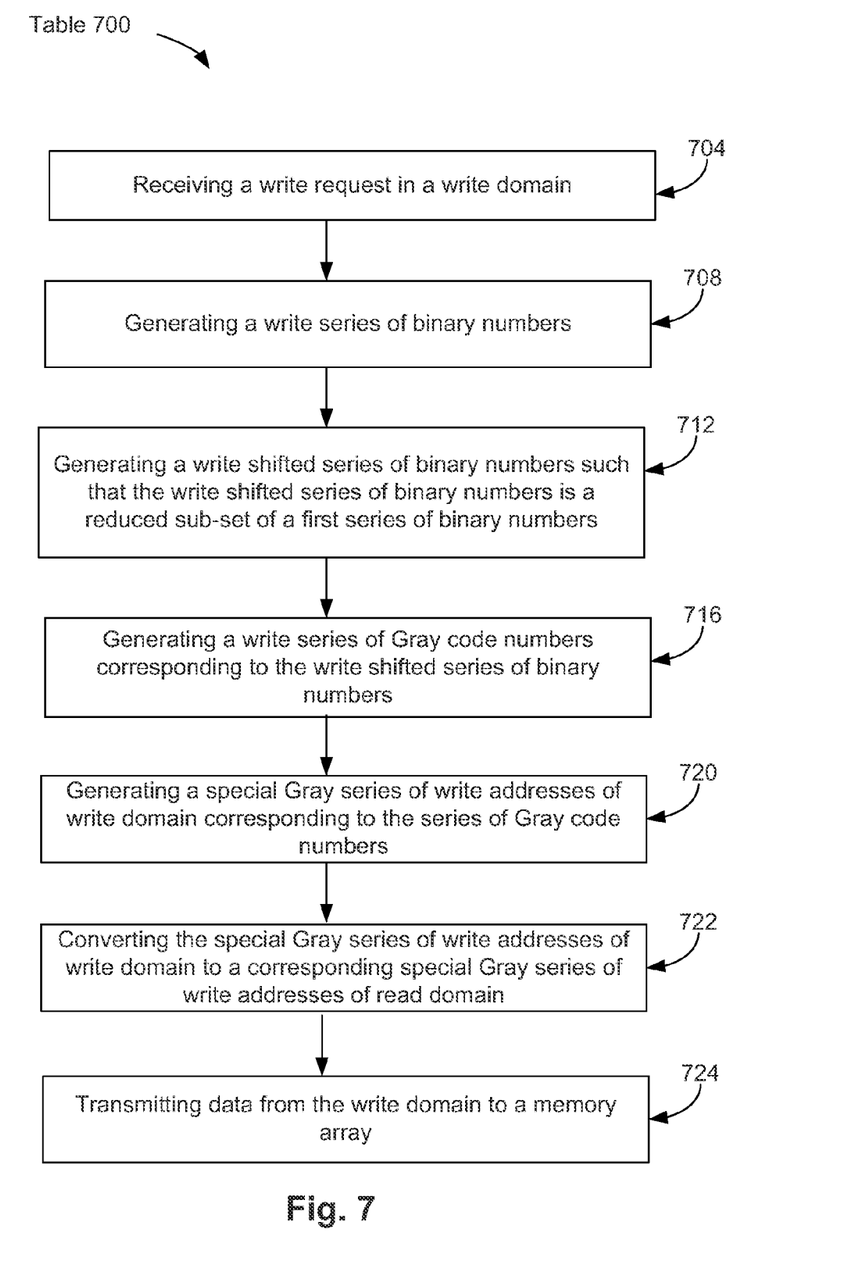
FIGS. 7 and 8 illustrate methods for operating the memory system of FIGS. 1-3 and 6, in accordance with an embodiment of the present disclosure.

FIG. 7 illustrates a method 700 for operating the memory system 10, in accordance with an embodiment of the present disclosure. The method 700 includes, at 704, receiving (e.g., by the write domain module 18a) a write request in the write clock domain 4a.

At 708, the write domain module 18a (e.g., the binary write address module 30a and/or the next write address module 34a) generates the write series of binary numbers, as illustrated in FIGS. 3 and 5. Although not illustrated in FIG. 7, the binary write address module 30a also generates a series of write addresses of write domain, which is transmitted to the memory array 12.

At 712, the shift and truncate module 60a generates (e.g., in response to receiving the write series of binary numbers) the write shifted series of binary numbers such that the write shifted series of binary numbers is a reduced sub-set of the first series of binary numbers (e.g., as illustrated in FIGS. 3, 4 and 5). In one embodiment, the first series of binary numbers is generated, and the write shifted series of binary numbers is generated from the first series of binary numbers. In another embodiment, the write shifted series of binary numbers is generated without generating the first series of binary numbers. As previously disclosed, the memory array 12 has 2M entries, where M is an integer, where the address width Y of the memory system 10 is equal to a ceiling function of logarithm of 2M to a base of 2, where K is an integer and is equal to $((2^Y-2M)/2)$, where the write shifted series of binary numbers includes 2M number of consecutive binary numbers starting from K. Thus, the write shifted series of binary numbers is generated such that the reduced subset of the first series of binary numbers excludes a first K number of binary entries and a last K number of binary entries of $2^Y$ number of consecutive binary entries of the first series of binary numbers.

The method 700 further comprises, at 716, generating (e.g., by the binary to Gray conversion module 38a) a write series of Gray code numbers corresponding to the write shifted series of binary numbers.

At 720, the write address generation module 42a generates a special Gray series of write addresses of write domain corresponding to the generated write series of Gray code numbers. In an embodiment, the special Gray series of write addresses of write domain corresponds to the generated write addresses of write domain. For example, each entry in the special Gray series of write addresses in write domain has a respective entry in the write addresses of write domain. At 722, the write to read synchronization module 26a converts (e.g., synchronizes) the special Gray series of write addresses in write domain to the corresponding special Gray series of write addresses in the read domain, based at least in part on the write clock signal 2a and the read clock signal 2b. At 724, the memory system 10 transmits write data from the write domain to the memory array 12, based at least in part on the write addresses of write domain, the special Gray series of write addresses of write domain, and the special Gray series of write addresses of read domain.

Figure 8:
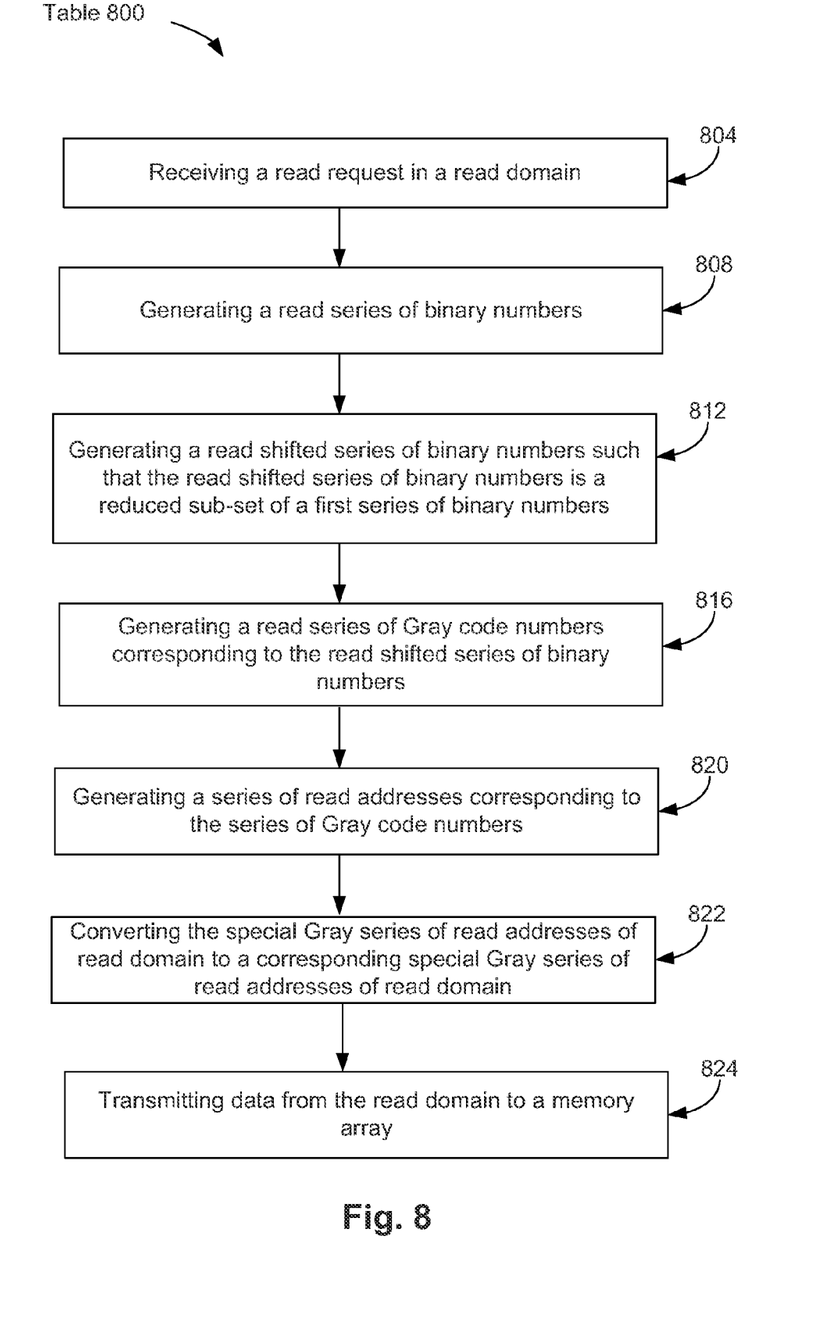

FIG. 8 illustrates a method 800 for operating the memory system 10, in accordance with an embodiment of the present disclosure. The method 800 includes, at 804, receiving (e.g., by the read domain module 18b) a read request in the read clock domain 4b.

At 808, the read domain module 18b (e.g., the binary read address module 30b and/or the next write address module 34b) generates the read series of binary numbers. Although not illustrated in FIG. 8, the binary read address module 30b also generates a series of read addresses of read domain, which is transmitted to the memory array 12.

At 812, the shift and truncate module 60b generates (e.g., in response to receiving the read series of binary numbers) the read shifted series of binary numbers such that the read shifted series of binary numbers is a reduced sub-set of a second series of binary numbers. In one embodiment, the second series of binary numbers is generated, and the read shifted series of binary numbers is generated from the second series of binary numbers. In another embodiment, the read shifted series of binary numbers is generated without generating the second series of binary numbers. The read shifted series of binary numbers includes 2M number of consecutive binary numbers starting from K. Thus, the read shifted series of binary numbers are generated such that the reduced subset of the second series of binary numbers excludes a first K number of binary entries and a last K number of binary entries of a $2^Y$ number of consecutive binary entries of the second series of binary numbers.

The method 800 further comprises, at 816, generating (e.g., by the binary to Gray conversion module 38b) a read series of Gray code numbers corresponding to the read shifted series of binary numbers.

At 820, the read address generation module 42b generates a special Gray series of read addresses corresponding to the generated read series of Gray code numbers. In an embodiment, the special Gray series of read addresses corresponds to the generated read addresses of read domain. For example, each entry in the special Gray series of read addresses has a respective entry in the read addresses of read domain. At 822, the read to write synchronization module 26b converts (e.g., synchronizes) the special Gray series of read addresses in read domain to the corresponding special Gray series of read addresses in the write domain, based at least in part on the write clock signal 2a and the read clock signal 2b. At 824, the memory system 10 transmits read data from the read domain to the memory array 12, based at least in part on the read addresses of read domain, the special Gray series of read addresses of write domain, and the special Gray series of read addresses of read domain.

Although specific embodiments have been illustrated and described herein, it will be appreciated by those of ordinary skill in the art and others, that a wide variety of alternate and/or equivalent implementations may be substituted for the specific embodiment shown and described without departing from the scope of the present disclosure. This disclosure covers all methods, apparatus, and articles of manufacture fairly falling within the scope of the appended claims either literally or under the doctrine of equivalents. This application is intended to cover any adaptations or variations of the embodiment disclosed herein. Therefore, it is manifested and intended that the disclosure be limited only by the claims and the equivalents thereof.

What is claimed is:

1. A method for operating a first in first out (FIFO) memory system in different clock domains, the method comprising:

receiving a write request in a first clock domain;
generating, by a shift and truncation module in response to receiving the write request, a shifted series of binary numbers such that the shifted series of binary numbers is a reduced sub-set of a first series of binary numbers; and
generating, by a binary to Gray conversion module, a series of Gray code numbers corresponding to the shifted series of binary numbers.

2. The method of claim 1, further comprising:
generating a special Gray series of write addresses corresponding to the series of Gray code numbers; and
transmitting data from the first clock domain to a memory array included in the FIFO memory system, based at least in part on the generated special Gray series of write addresses.

3. The method of claim 1, wherein the FIFO memory system comprises a memory array having 2M entries, wherein M is an integer, wherein Y is an integer and is equal to a ceiling function of logarithm of 2M to a base of 2, wherein K is an integer and is equal to $((2^Y-2M)/2)$, wherein generating the shifted series of binary numbers further comprises:
generating the shifted series of binary numbers such that the shifted series of binary numbers includes 2M number of consecutive binary numbers starting from K.

4. The method of claim 1, wherein the FIFO memory system comprises a memory array having 2M entries, wherein M is an integer, wherein Y is an integer and is equal to a ceiling function of logarithm of 2M to a base of 2, wherein K is an integer and is equal to $((2^Y-2M)/2)$, wherein the first series of binary numbers include $2^Y$ number of consecutive binary numbers starting from 0, wherein generating the shifted series of binary numbers further comprises:
generating the shifted series of binary numbers such that the reduced subset of the first series of binary numbers excludes a first K number of binary entries and a last K number of binary entries of the $2^Y$ number of consecutive binary entries of the first series of binary numbers.

5. The method of claim 1, wherein generating the shifted series of binary numbers further comprises:
generating the first series of binary numbers; and
generating the shifted series of binary numbers based at least in part on the first series of binary numbers.

6. The method of claim 1, wherein generating the shifted series of binary numbers further comprises:
generating the shifted series of binary numbers without actually generating the first series of binary numbers.

7. The method of claim 1, further comprising:
receiving a read request in a second clock domain;
generating, in response to receiving the read request, a read shifted series of binary numbers such that the read shifted series of binary numbers is another reduced sub-set of a second series of binary numbers;
generating a read series of Gray code numbers corresponding to the read shifted series of binary numbers;
generating a special Gray series of read addresses corresponding to the generated read series of Gray code numbers; and
transmitting data from a memory array included in the FIFO memory system to the second clock domain, based at least in part on generating the special Gray series of read addresses.

8. The method of claim 7, wherein the memory array comprises 2M entries, wherein M is an integer, wherein Y is an integer and is equal to a ceiling function of logarithm of 2M to a base of 2, wherein K is an integer and is equal to $((2^Y-2M)/2)$, wherein the first series of binary numbers include $2^Y$ number of consecutive binary numbers, wherein generating the read shifted series of binary numbers further comprises:
generating the read shifted series of binary numbers such that the another reduced subset of the second series of binary numbers excludes a first K number of binary entries and a last K number of binary entries of the $2^Y$ number of consecutive binary entries of the second series of binary numbers.

9. The method of claim 7, further comprising:
clocking one or more components of the first clock domain using a first clock signal; and
clocking one or more components of the second domain using a second clock signal with a frequency that is different from a frequency of the first clock signal.

10. A memory system comprising:
a memory array; and
a memory controller that includes a write domain module configured to receive a write request from a write clock domain, the write domain module comprising:
a shift and truncation module configured to generate a shifted series of binary numbers such that the shifted series of binary numbers is a reduced sub-set of a first series of binary numbers; and
a binary to Gray conversion module configured to generate a series of Gray code numbers corresponding to the shifted series of binary numbers.

11. The memory system of claim 10, wherein the write domain module further comprises:
a binary write address module configured to generate write addresses of write domain;
a write address generation module configured to generate a special Gray series of write addresses corresponding to the series of Gray code numbers, such that each entry in the special Gray series of write addresses has a respective entry in the write addresses of write domain;
wherein the memory system is configured to transmit data from the write clock domain to the memory array, based at least in part on the special Gray series of write addresses and the write addresses of write domain.

12. The memory system of claim 10, wherein the memory array has 2M entries, wherein M is an integer, wherein Y is an integer and is equal to a ceiling function of logarithm of 2M to a base of 2, wherein K is an integer and is equal to $((2^Y-2M)/2)$, wherein the shifted series of binary numbers includes 2M number of consecutive binary numbers starting from K.

13. The memory system of claim 10, wherein the memory array has 2M entries, wherein M is an integer, wherein Y is an integer and is equal to a ceiling function of logarithm of 2M to a base of 2, wherein K is an integer and is equal to $((2^Y-2M)/2)$, wherein the first series of binary numbers include $2^Y$ number of consecutive binary numbers starting from 0, wherein the shifted series of binary numbers are generated such that the reduced subset of the first series of binary numbers excludes a first K number of binary entries and a last K number of binary entries of the $2^Y$ number of consecutive binary entries of the first series of binary numbers.

14. The memory system of claim 10, wherein the memory controller includes a read domain module configured to receive a read request from a read clock domain, wherein the shift and truncation module is a first shift and truncation module, wherein the binary to Gray conversion module is a first binary to Gray conversion module, wherein the read domain module comprises:
a second shift and truncation module configured to generate a read shifted series of binary numbers such that the read shifted series of binary numbers is another reduced sub-set of a second series of binary numbers; and a second binary to Gray conversion module configured to generate a read series of Gray code numbers corresponding to the read shifted series of binary numbers.

15. The memory system of claim 14, wherein the read domain module further comprises:
   a read address generation module configured to generate a special Gray series of read addresses corresponding to the read series of Gray code numbers;
   wherein the memory system is configured to transmit data from the memory array to the read clock domain, based at least in part on the special Gray series of read addresses.

16. The memory system of claim 10, wherein the memory system is a dual clock first in, first out (FIFO) memory system.

17. A system-on-chip (SOC) comprising:
   a processor; and
   a memory system comprising:
      a memory array, wherein the memory array has 2M entries, wherein M is an integer, wherein Y is an integer and is equal to a ceiling function of logarithm of 2M to a base of 2, wherein K is an integer and is equal to $((2^Y-2M)/2)$; and
      a memory controller that includes a read domain module configured to receive a read request from a read clock domain, the read domain module comprising:
         a first shift and truncation module configured to generate a read shifted series of binary numbers, wherein the read shifted series of binary numbers includes 2M number of consecutive binary numbers starting from K; and
         a first binary to Gray conversion module configured to generate a read series of Gray code numbers corresponding to the read shifted series of binary numbers.

18. The SOC of claim 17, wherein the memory controller further includes a write domain module configured to receive a write request from a write clock domain, the write domain module comprising:
   a second shift and truncation module configured to generate a write shifted series of binary numbers, wherein the write shifted series of binary numbers includes 2M number of consecutive binary numbers starting from K; and
   a second binary to Gray conversion module configured to generate a write series of Gray code numbers corresponding to the write shifted series of binary numbers.

19. The SOC of claim 17, wherein the read clock domain is clocked by a read clock signal, and wherein the write clock domain is clocked by a write clock signal with a frequency that is different from a frequency of the read clock signal.

20. The SOC of claim 17, wherein the memory system is a dual clock first in, first out (FIFO) memory system.

* * * * *